United States Patent
Dutta et al.

(10) Patent No.: US 10,831,961 B2
(45) Date of Patent: Nov. 10, 2020

(54) AUTOMATED COVERAGE CONVERGENCE BY CORRELATING RANDOM VARIABLES WITH COVERAGE VARIABLES SAMPLED FROM SIMULATION RESULT DATA

(71) Applicant: Synopsys, Inc., Mountain View, CA (US)

(72) Inventors: Esha Dutta, Karnataka (IN); Danish Jawed, Karnataka (IN); Bhaskar Pal, Karnataka (IN); Parijat Biswas, Karnataka (IN); Pravash Chandra Dash, Karnataka (IN); Rajarshi Mukherjee, Karnataka (IN); Sharad Gaur, Larmatala (OM)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/510,810

(22) Filed: Jul. 12, 2019

(65) Prior Publication Data

US 2020/0019664 A1 Jan. 16, 2020

(30) Foreign Application Priority Data

Jul. 14, 2018 (IN) .............................. 201811026365

(51) Int. Cl.
*G06F 30/367* (2020.01)
*G06F 30/398* (2020.01)

(52) U.S. Cl.
CPC .......... *G06F 30/367* (2020.01); *G06F 30/398* (2020.01)

(58) Field of Classification Search
CPC ... G06F 30/367; G06F 30/398; G06F 30/3312
See application file for complete search history.

(56) References Cited

U.S. PATENT DOCUMENTS 6,513,144 B1   1/2003   Kim et al.
6,742,166 B2 *   5/2004   Foster ..................... G06F 30/33
      716/106

(Continued)

FOREIGN PATENT DOCUMENTS

CN   107193738 A   9/2017
CN   107704384 A   2/2018

OTHER PUBLICATIONS

Cheng, An-Che et al., document entitled "A Formal Method to Improve System Verilog Functional Coverage", IEEE, 2012, 8 pages.

(Continued)

*Primary Examiner* — Nha T Nguyen
(74) *Attorney, Agent, or Firm* — Bever, Hoffman & Harms, LLP

(57) ABSTRACT

A data analysis engine is implemented in a testbench to improve coverage convergence during simulation of a device-under-validation (DUV). During a first simulation phase initial stimulus data is generated according to initial random variables based on user-provided constraint parameters. The data analysis engine then uses a time-based technique to match coverage variables sampled from simulation response data with corresponding initial random variables, determines a functional dependency (relationship) between the sampled coverage variables and corresponding initial random variables, then automatically generates revised constraint parameters based on the functional dependency. The revised constraint parameters are then used during a second simulation phase to generate focused random variables used to stimulate the DUV to reach additional coverage variables. In one embodiment, the functional dependency is determined by cross-correlating sampled coverage variables and corresponding initial random variables.

20 Claims, 10 Drawing Sheets

(56) References Cited

U.S. PATENT DOCUMENTS

| | | | |
|---|---|---|---|
| 7,114,111 B2 * | 9/2006 | Noy | G01R 31/31707 714/738 |
| 7,181,376 B2 * | 2/2007 | Fine | G06F 11/261 703/2 |
| 7,904,846 B2 | 3/2011 | Thakur et al. | |
| 8,386,974 B2 | 2/2013 | Biswas et al. | |
| 8,443,316 B1 | 5/2013 | Biswas et al. | |
| 8,543,953 B2 * | 9/2013 | Boehm | G06F 30/33 716/111 |
| 8,650,519 B2 * | 2/2014 | Boehm | G06F 30/33 716/108 |
| 8,826,202 B1 * | 9/2014 | Goel | G06F 30/3323 716/106 |
| 9,891,281 B1 * | 2/2018 | Kinderman | G06F 30/20 |
| 2003/0018945 A1 * | 1/2003 | Foster | G06F 30/33 716/106 |
| 2004/0216023 A1 * | 10/2004 | Maoz | G01R 31/31707 714/742 |
| 2005/0102596 A1 * | 5/2005 | Hekmatpour | G06F 30/33 714/741 |
| 2009/0037858 A1 * | 2/2009 | Thakur | G06F 30/398 716/106 |
| 2013/0174108 A1 * | 7/2013 | Boehm | G06F 30/33 716/106 |
| 2014/0282315 A1 * | 9/2014 | Wakefield | G06F 30/3323 716/106 |
| 2019/0377666 A1 * | 12/2019 | Klein | G06F 11/3684 |

OTHER PUBLICATIONS

Teplitsky, Marat et al., document entitled "Coverage Driven Distribution of Constrained Random Stimuli", Cadence Design Systems, Israel, 2015, 8 pages.

* cited by examiner

AUTOMATED COVERAGE CONVERGENCE BY CORRELATING RANDOM VARIABLES WITH COVERAGE VARIABLES SAMPLED FROM SIMULATION RESULT DATA

RELATED APPLICATION

This application claims priority from Indian Provisional patent application serial number IN201811026365 entitled "AUTOMATED COVERAGE CONVERGENCE USING SMART ANALYSIS OF SIMULATION DATA", which was filed on Jul. 14, 2018, and is incorporated by reference herein.

FIELD OF THE INVENTION

The present disclosure generally relates to electronic circuits, and more specifically to verification processes utilized to verify properties of electronic circuit designs prior to manufacture.

BACKGROUND OF THE INVENTION

As circuits have become more complex, electronic design automation (EDA) software tools have been developed to facilitate designing, testing and modifying circuit designs in preparation for manufacturing (i.e., fabricating or otherwise producing) physical circuit structures that are based on final versions of the circuit designs. Because modern circuit structures (e.g., System-on-Chip devices) can include billions of transistors and other circuit elements, EDA tools have become essential in the development and testing of modern circuit designs. That is, without EDA software tools, generating a modern circuit from concept to physical circuit using manual design techniques would be virtually impossible.

FIG. 13 is a block diagram showing portions of a greatly simplified conventional EDA software tool 50 that are utilized to perform simulation-type verification of a circuit design 60, which is either generated using other portions (not shown) of EDA software tool 50 or transferred to EDA software tool 50 from another EDA software tool. As indicated in FIG. 13, simulation is typically performed using verification software tools known in the art as a testbench (aka, "test-bench") 70 and a simulator 80 to verify the correctness of circuit design 60. Testbench 70 typically includes a random variable generator 71 that translates user-supplied constraint parameters CP and generates associated random variables RV, a stimulus generator 72 that is configured to generate stimulus data SD (i.e., a sequence of binary test vector values) in accordance with random variables RV, and a data analyzer 75 configured to collect and analyze simulation response data SRD transmitted from simulator 80. Simulator 80 is configured to store and emulate DUV 65, which is a version of circuit design 60 that has been written in (or translated into) a specified software language understood by simulator 80, such as Verilog, VHDL or Spice. During simulation, simulator 80 receives stimulus data SD from stimulus generator 72 and applies the input stimuli to designated nodes of DUV 65 and collects response data from designated output nodes (i.e., sequences of binary signal values generated by DUV 65 at the designated output nodes in response to stimulus data SD). Data analyzer 75 receives response data SRD rom simulator 80 and, for example, compares the received response data with user-supplied expected response data, and generates a verification test result report 77 that is transmitted in a operable form to a user (e.g., a verification engineer tasked to verify circuit design 60). In combination, testbench 70 and simulator 80 provide EDA tool 50 with a versatile tool for functionally verifying the operation of circuit designs in a manner that allows circuit designers (users) to identify and correct flaws (bugs) in their circuit designs (e.g., circuit design 60) before incurring the significant expense of manufacturing physical circuits based on their circuit designs.

In general, many stimuli and simulation runs are needed to achieve a reasonable coverage of the behavior of a given DUV. Coverage is a key metric that measures the quality and project completeness in the functional verification of the associated circuit design. Types of coverage targets can be characterized as either functional coverage targets or code coverage targets. In a functional coverage target, a user wants some scenario to happen in the design. For example, the user wants signal A to have value X at the same time that signal B has value Y. In contrast, the code coverage target can include a branch (if, case) statement, and line coverage. These types of coverage targets are well known and therefore not described in further detail.

The goal of verification is to simulate the DUV in a constrained random environment and to hit a predefined set of coverage goals by doing unit level testing. Unit level testing is a level of software testing where individual units/components of a software product are tested. The purpose is to validate that each unit of the software product performs as designed. A unit is the smallest testable part of any software. It usually has one or a few inputs and usually a single output.

Conventional functional verification uses constrained random simulation, which enables users to go from 0 to 80-90% coverage by automatically creating thousands of tests (i.e. different stimuli). However, getting the remaining 10-20% coverage is a very time consuming and difficult manual process. Typically, this process requires verification engineers to work with design engineers to analyze the coverage obtained so far, identify coverage holes, determine reasons for not reaching missing coverage targets, and write new tests to hit missing targets and achieve coverage convergence. Unfortunately, this coverage convergence phase of verification can take up to 30% of the overall chip development cycle.

Many times, verification engineers perform manual analysis for each coverage point to increase the coverage. However, this process is very complex considering the large number of functional coverage points and complex test bench construct.

Previous techniques for automatically reaching missing coverage targets have encountered severe scalability problems, requiring extensive modifications to existing verification tools. One such technique relies on randomly changing paths based on symbolic properties with the goal of executing new, previously un-explored branches in the code. See for example, Accelerating coverage convergence and debug using symbolic properties and local multi-path analysis, U.S. Pat. No. 8,443,316. A. Cheng et. al. teach in "A Formal Method to Improve System Verilog Functional Coverage", 2012, 2012 IEEE International High Level Design, creating an equation based on the netlist and a constraint problem, and then using a SAT solver. M. Teplitsky et al. teach in "Coverage Driven Distribution of Constrained Random Stimuli"Cadence Design Systems, Israel, adding distribution directives in the language for improving constraint random test generation to cover coverage holes. U.S. Pat. No. 7,904,846 teaches creating a covergroup automatically based on provided constraints (normally covergroup creation itself is a tedious time-consuming process). U.S. Pat. No. 8,386,974 teaches using a symbolic simulation to increase coverage. U.S. Pat. No. 6,513,144 teaches adding language features to VERA language to perform constraint random stimulus generation. Other approaches utilize machine learning techniques (e.g., see U.S. Pat. No. 7,181,376 uses a Bayesian network) that require significant amounts of simulation result training data, which makes maintaining such machine learning techniques very computationally expensive.

What is needed is a method for automatically achieving higher coverage point coverage while avoiding the problems associated with conventional methods. In particular, what is needed is an improved test bench for EDA software tools that is capable of automatically improving coverage goals without requiring complex or fundamental changes to known test bench configurations, and without requiring computationally expensive processes and/or training data.

SUMMARY OF THE INVENTION

The present invention is directed to an improved coverage verification method in which sampled coverage point variables reached during an initial (first) simulation process phase are efficiently matched with corresponding initial random variables utilized to stimulate a device-under-verification (DUV), and then to automatically generate revised constraint parameters based on the corresponding (matched) initial random variables that are then used during a subsequent (second) simulation process phase. The inventors observed that a functional relationship often exists between a coverage point having multiple coverage point solutions and the multiple corresponding random variables required to reach the multiple coverage point solutions (i.e., the coverage point solution is produced/sampled when any of multiple corresponding random variables is used to simulate the DUV). That is, the inventors determined that each of the corresponding random variables required to reach a given coverage point solution often includes pattern portions that are either directly matched with or a function of the other corresponding random variables. In addition, the inventors observed that there is high likelihood that a coverage point solution sampled at a specific time period during simulation will be reached in response to a corresponding random variable generated and utilized to stimulate the DUV a predetermined amount of time before (i.e., concurrently with or immediately before) the specific time period in which the coverage point solution appeared in the simulation response data. Based on these observations, the inventors determined that coverage goals may be efficiently improved by way of utilizing a time-based association process to identify the initial random variable corresponding to each sampled coverage point solution variable, and to then generating revised constraint parameters that are operably based on the identified corresponding initial random variable that are then used to automatically generate focused random variables having values that are systematically tuned to include similar or functionally related pattern portions of the identified initial random variable and one or more randomly generated pattern portions, whereby the focused random variables can then be used to achieve higher coverage in a subsequent (second) simulation process phase. The present invention thus greatly improves the functioning of a computer configured to implement coverage-type verification/simulation by way of automatically increasing the number of coverage point solutions reached during a given simulation process without requiring the computationally expensive processes and/or training data required by conventional approaches.

According to a practical exemplary embodiment, the present invention is implemented by way of an improved testbench that is provided as part of an EDA software tool. The improved testbench is operably configured to perform an initial (first) simulation process phase using substantially conventional techniques, where initial constraint parameters provided by a verification engineer are utilized to generate the initial random variables that are utilized to generate initial stimulus data applied to a simulator/DUV, and initial simulation response data, which is generated by the DUV in response to the initial stimulus data, is captured for analysis. The improved testbench primarily differs from conventional testbenches by way of including a data analysis engine that is configured to receive the sequentially generated initial random variables and sampled coverage point variables reached during the initial simulation process phase, to identify one or more initial random variables corresponding to each sampled coverage point variable with using a time-based matching process, and then to generate revised constraint parameters that are based on the identified initial random variables. By observing that the corresponding initial random variable responsible for each reached/sampled coverage point variable is implemented immediately before or concurrently with the associated sampled coverage point variable, the data analysis engine efficiently identifies corresponding initial random variables using the time-based matching process. Moreover, by observing that other random variables required to reach the coverage point solution are typically functionally related to the identified corresponding initial random variables, the data analysis engine facilitates a substantially higher likelihood of reaching additional coverage point solutions by way of generating the revised constraint parameters based on the identified initial random variables. The testbench then performs a subsequent (second) simulation phase in which focused random variables are generated in accordance with the revised constraint parameters, and then (second) stimulus data is generated from the focused random variables and applied to the DUV. Because the focused random variables are functionally related to (e.g., include data pattern sections that are the same as those used by) the identified initial random variable, the subsequent (second) simulation phase provides a higher probability of reaching additional coverage point solutions than if entirely random variables were utilized in the second simulation phase. Therefore, the present invention facilitates higher coverage point coverage without requiring complex or fundamental changes to known testbench configurations and without requiring computationally expensive processes and extensive memory resources for storing training data, whereby the present invention may be incorporated into existing EDA tools with minimal expense.

According to a presently preferred embodiment, the generation of revised constraint parameters includes cross-correlating the sampled coverage variables and correlated random variables and utilizing the results of the cross-correlation to generate the revised constraint parameters.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improved test bench and associated methods for use during the development of circuit designs that are subsequently utilized in the fabrication of physical circuits based on the circuit designs. The Figures and the following Detailed Description signify innovations, embodiments and/or examples by way of illustration only, with various features, structures or characteristics described together in a single embodiment to streamline the disclosure. Variations of any of the elements, processes, machines, systems, manufactures or compositions disclosed by such exemplary innovations, embodiments and/or examples will be readily recognized and may be used in commerce without departing from the principles of what is claimed. The Figures and Detailed Description may also signify, implicitly or explicitly, advantages and improvements of a subset of the exemplary embodiments described herein.

In the Figures and Detailed Description, numerous specific details may be described to provide a thorough understanding of one or more of the exemplary embodiments. In the interest of not obscuring the presentation of embodiments of the claimed inventions, in the following Detailed Description, some processing steps or operations that are known in the art may have been combined together for presentation and for illustration purposes and in some instances may have not been described in detail. However, a person skilled in the art will recognize that these embodiments may be used in commerce without these specific details or with equivalents thereof. In other instances, well-known processes and devices are not described in detail as not to unnecessarily obscure aspects of these embodiments. In other instances, some processing steps or operations that are known in the art may not be described at all. The following description is instead focused on the distinctive features or elements of various embodiments of the claimed inventions. Furthermore, while this description may refer to some components of the structure in the singular tense, more than one component may be depicted throughout the figures and like components are labeled with like numerals.

Figure 1:
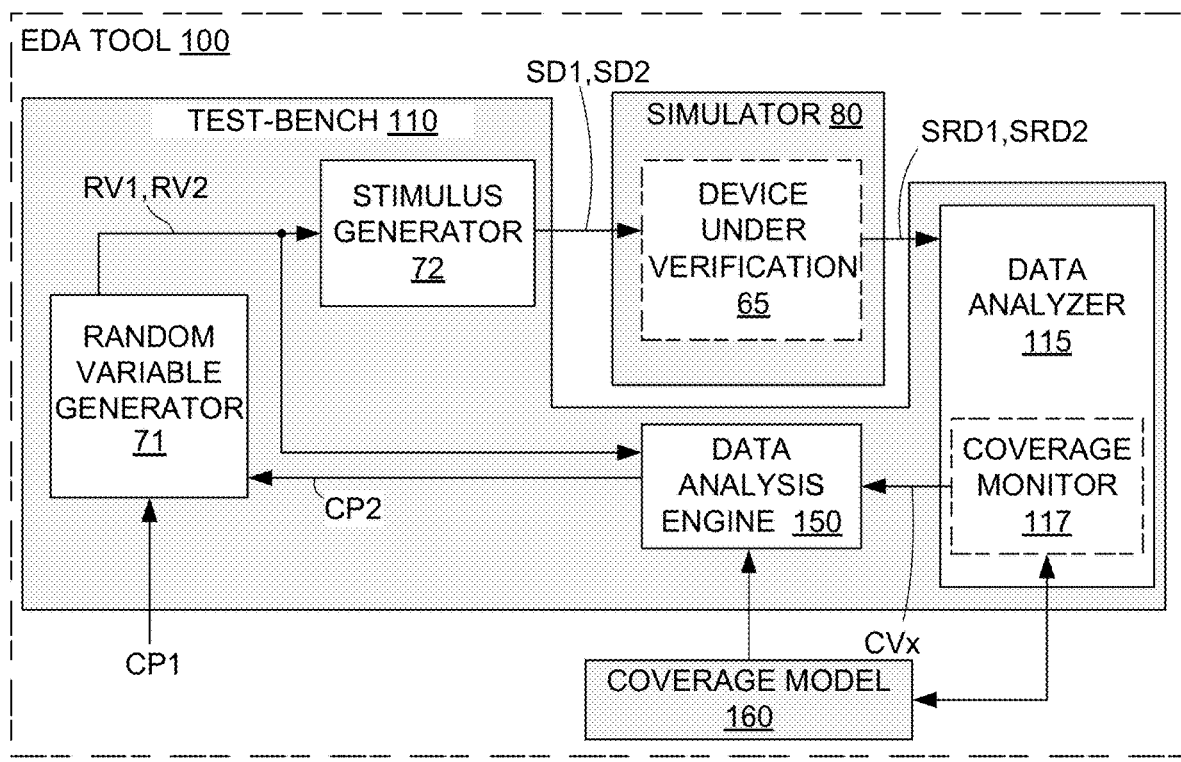
FIG. 1 is a block diagram depicting a partial EDA tool including a simplified improved test bench having a data analysis engine configured in accordance with an embodiment of the present invention.
Figure 13:
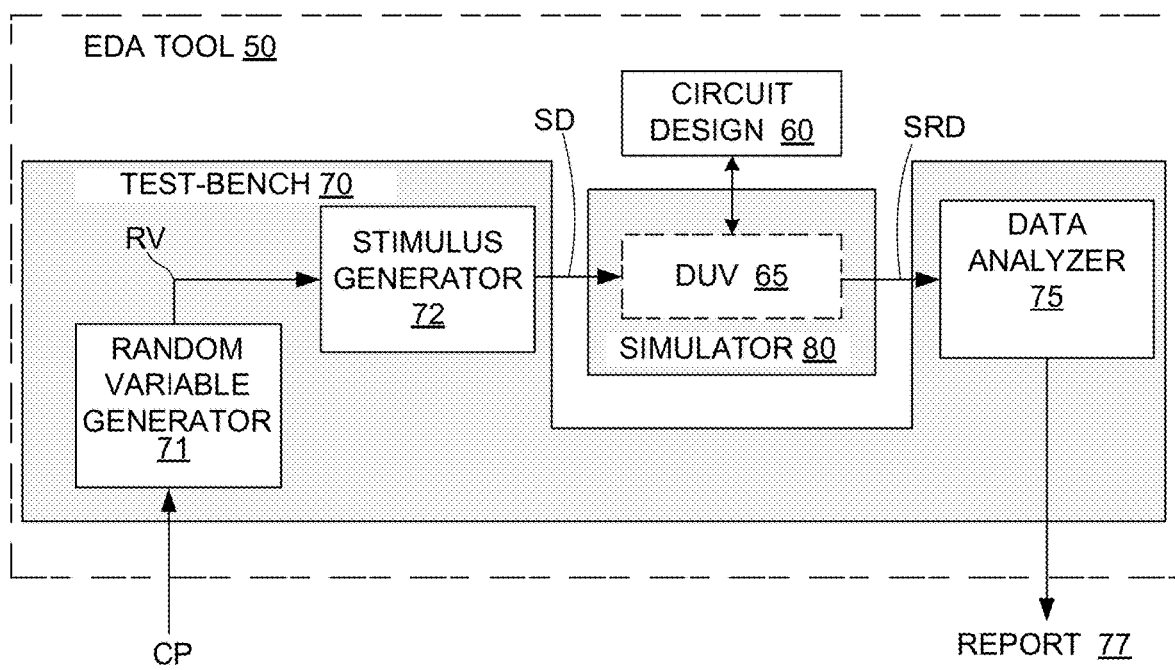
FIG. 13 is a block diagram depicting an EDA tool including a conventional test bench.

FIG. 1 is a block diagram showing portions of a greatly simplified EDA software tool 100 including an improved testbench 110 configured in accordance with a generalized embodiment of the present invention. Similar to conventional testbench 50 (see FIG. 13), testbench 110 operates in conjunction with a simulator 80 to facilitate coverage-type verification of a circuit design 60 by way of performing simulation-type verification of a DUV 65. In one embodiment, testbench 110 utilizes a random variable generator 71 configured to generate random variables in response to supplied constraint parameters, and a stimulus generator 72 that is configured to generate stimulus data in response to received random variables, where random variable generator 71 and stimulus generator 72 utilize the substantially conventional techniques described above with reference to FIG. 13. Note that, although random variable generator 71 receives additional constraints CP2, Simulator 80 is also configured to operate substantially as described above with reference to FIG. 13, and to transmit simulation response (result) data to data analyzer 115.

Testbench 110 differs from conventional testbench configurations by including a modified data analyzer 115 and a data analysis engine 150.

Data analyzer 115 is similar to a conventional data analyzer (e.g., data analyzer 75 shown in FIG. 13) in that it analyzes simulation result (response) data SRD1 received from simulator 80 during the first simulation process phase using techniques known in the art. Data analyzer 115 differs from conventional data analyzers by way of including a coverage monitor 117 that is configured using known techniques to keep track of the extent to which coverage goals are satisfied by way of communicating with a coverage model 160, to sample (i.e., recognize and copy) coverage point variable values CVx that are included in simulation result data SRD1, and transmit sampled coverage point variable values CVx to data analysis engine 150. For example, when coverage model 160 includes a coverage point having four possible solutions, coverage monitor 117 monitors simulation result data SRD1 for the occurrence of four corresponding coverage variables (i.e., signal patterns in simulation result data SRD1 corresponding to one of the four coverage point solutions), samples (e.g., copies) each occurring coverage variable, and transmits the sampled coverage variable to data analysis engine 150. In one embodiment, data analyzer 115 otherwise operates in a manner consistent with corresponding data analyzer tools used in conventional testbench configurations.

Coverage model 160, which may be incorporated into testbench 100 using known techniques, stores predefined coverage points (goals) in the form of coverage point variable values representing corresponding operating states of DUV 65. Note that coverage point variable values (coverage variables or coverage point solutions) are not exactly properties of a DUV, but instead represent part of coverage model 160 created by a design/verification engineer to monitor interesting scenarios (critical system operating states) of DUV 65 in the constrained randomized testing environment provided by testbench 110 and simulator 80. As mentioned above, in an ideal testing environment the coverage of each of these coverage variables should be 100%, but in reality verification engineers struggle to meet even 80% coverage. As set forth below, data analysis engine 150 implements a simple, statistical process (e.g., based on computation of cross-correlation between sampled coverage variables and corresponding initial random variables) to enhance the coverage of testbench 110 using techniques that have not been previously utilized in the domain of coverage convergence.

As indicated in FIG. 1, data analysis engine 150 is configured to receive initial random variables RV1 generated by random variable generator 71, and to also receive sampled coverage point variable values CVx from coverage monitor 117. As set forth in additional detail below, data analysis engine 150 is configured to identify corresponding initial random variable RV1 for each sampled coverage point solution variable CVx received from coverage monitor 117, and to generate revised constraint parameters CP2 based on the identified corresponding random variables RV1. In one embodiment, the identification of corresponding initial random variables is performed using a time-based process in which a time-stamp value generated when a coverage variable is sampled is utilized to identify one or more initial random variables RV1 generated by random variable generator 71 either concurrently with or immediately before the time-stamp value. In one embodiment, generation of the revised constraint parameters CP2 comprises determining a functional dependency between each sampled coverage variable CVx and corresponding initial random variable(s) RV1, and generating constraint parameters that include the determined functional dependency. Data analysis engine 150 then transmits revised constraint parameters CP2 to random variable generator 71, which then generates corresponding focused random variables RV2 that are utilized during a second simulation process phase as described below. In the exemplary embodiment, random variable generator 71 receives and processes both initial constraint parameters CP1 and revised constraint parameters CP2 using the same conventional techniques (i.e., random variable generator 71 may be utilized for both the first and second simulation phases).

Figure 2:
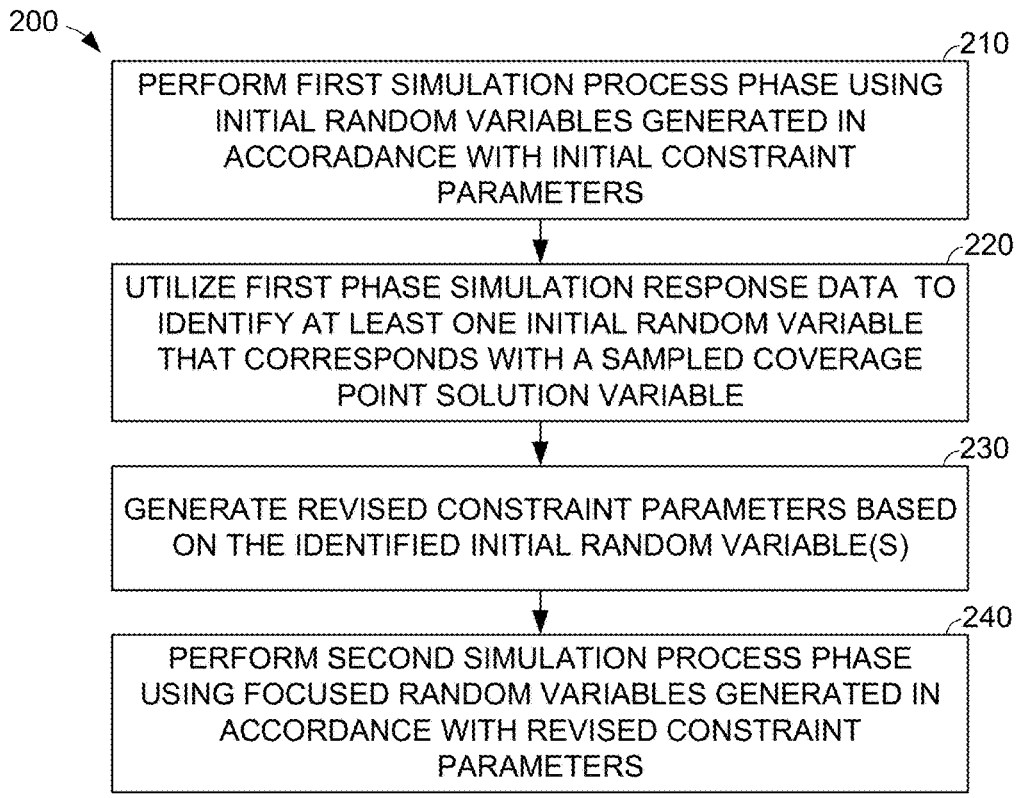
FIG. 2 is a flow diagram depicting a generalized method for performing coverage verification of a circuit design using the improved test bench of FIG. 1 according to another embodiment of the present invention.

FIG. 2 is a flow diagram depicting an improved simulation methodology 200 according to a generalized embodiment of the present invention. Generalized methodology 200 is described below with reference to EDA tool 100 (FIG. 1), and is performed in a computer (e.g., computer 3110, described below with reference to FIG. 12B). Methodology 200 includes a two-phase simulation process performed by a testbench (e.g., improved testbench 110, FIG. 1) that is configured to generate and apply simulation data (e.g., simulation data SD1 and SD2, shown in FIG. 1) to a simulator-based DUV (e.g., DUV 65 disposed in simulator 80, as shown in FIG. 1), where the testbench receives simulation result data (e.g., simulation result/response data SRD1, shown in FIG. 1) generated by the DUV in response to the applied simulation data, and where the simulation result data includes a coverage point solution variable each time the applied simulation data causes the DUV to reach an operating state that matches a coverage variable stored in coverage report 160.

Referring to the upper portion of FIG. 2, the methodology begins with a first simulation process phase (block 210) that is performed using substantially conventional techniques. Specifically, initial random variables RV1 are generated by random variable generator 71 in response to user-supplied initial constraint parameters CP1, which may be produced/provided by a verification engineer using techniques known in the art. As described above, initial random variables RV1 are transmitted to stimulus generator 72 and to data analysis engine 150. Stimulus generator 72 generates a corresponding initial stimulus data value SD1 for each initial random variable RV1 and transmits the initial stimulus data values SD1 to simulator 80. Simulator 80 applies initial stimulus data values SD1 to targeted input nodes of DUV 65, collects corresponding simulation response data values SRD1 from targeted output nodes of DUV 65, and transmits simulation response data values SRD1 to data analyzer 115. In one embodiment the first simulation phase and random variable generator 71 may differ from conventional techniques/devices in that each initial random variable RV1 transmitted from random variable generator 71 to data analysis engine 150 includes a corresponding time-stamp value indicating its time of generation by random variable generator 71.

The simulation result data generated during the first simulation process phase is utilized to identify one or more initial random variable values that correspond to each sampled coverage point solution/variable (block 230, FIG. 2). For example, referring to FIG. 1, when coverage monitor 117 recognizes in simulation result data SRD1 the occurrence of a coverage variable that is stored in coverage model 160, then coverage monitor 117 transmits a corresponding sampled coverage variable CVx to data analysis engine 150, whereby data analysis engine 150 utilizes sampled coverage variable CVx (i.e., part of first simulation phase result data SRD1) to identify at least one corresponding initial random variable RV1 (e.g., by way of matching the time-stamp values assigned to a set of buffered initial random variable RV1 with a time-based value associated with the sampled coverage variable CVx). In a presently preferred embodiment, data analysis engine 150 calculates a correlation value for each random variable based on functional dependency between each corresponding random variable and the sampled coverage variable, and then performs further processing only on one or more corresponding random variable having the highest correlation value(s).

Once one or more corresponding initial random variables are identified (selected) for each coverage variable sampled during the first simulation phase, one or more revised constraint parameters are generated for the identified initial random variables (block 230, FIG. 2). Referring to FIG. 1, in one embodiment data analysis engine 150 is configured to generate revised constraint parameters CP2 based on the selected/identified corresponding initial random variable(s) RV1 using known techniques.

A second simulation phase is then performed using focused random variables generated in accordance with the revised constraint parameters (block 240, FIG. 2). Referring to FIG. 1, in the exemplary embodiment revised constraint parameters CP2 are transmitted from data analysis engine 150 to random variable generator 71, which generates focused random variables RV2 using the same methodology as that used during the first simulation process phase. That is, in a presently preferred embodiment random variable generator 71 is utilized to generate random variables during both the first and second simulation phases. That is, the only difference between focused random variables RV2 and initial random variables RV1 is that focused random variables RV2 are generated in accordance with revised constraint parameters CP2, whereas initial random variables RV1 are generated in accordance with initial constraint parameters CP1. Because revised constraint parameters CP2 are based on corresponding initial random variables, which are functionally related to sampled coverage variables CVx, the focused random variables RV2 are more likely to generate additional coverage solutions per simulation cycle than non-focused random variables (e.g., initial random variables RV1). Accordingly, methodology 200 automatically achieves higher coverage point coverage while avoiding the problems associated with conventional methods.

Figure 3:
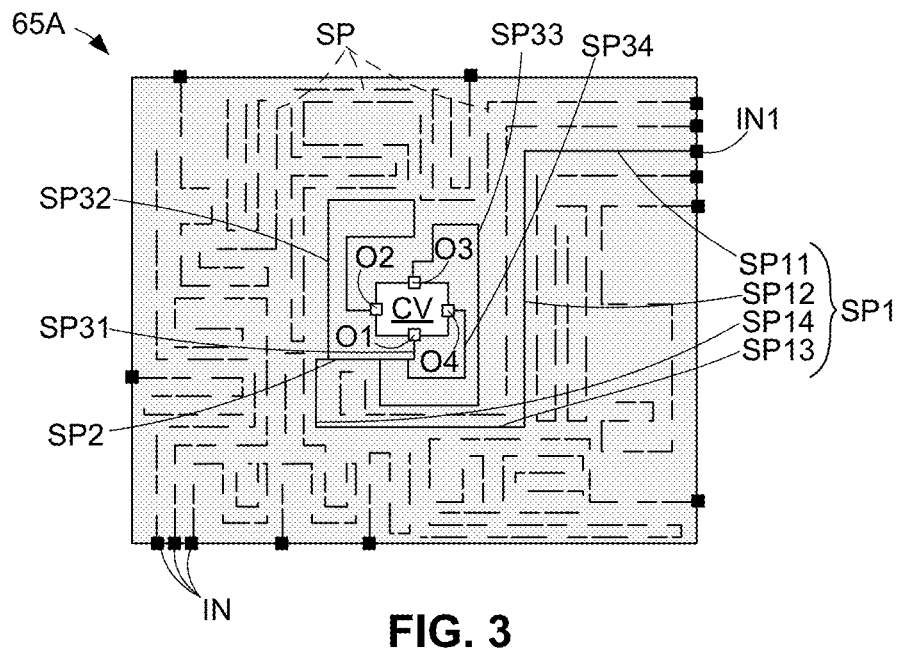
FIG. 3 is a diagram depicting a simplified DUV in an analogous graphic format that is utilized to describe the improved coverage simulation/verification method of the present invention.

FIG. 3 is a simplified graphic representation depicting an analog DUV 65A for purposes of describing the present invention. Those skilled in the art will understand that the features utilized to illustrate random variables and coverage variables in analog DUV 65A are greatly simplified for purposes of explaining various aspects and benefits of the present invention, and the features described below are not necessarily representative of an actual circuit design. Accordingly, the following description of analog DUV 65 is not intended to limit the appended claims.

Referring to FIG. 3, analog DUV 65A includes various lines that represent possible simulation "signal paths" generated in response to applied stimulus signals, and a centrally located box indicating a single coverage variable CV (i.e., coverage point solution). The solid squares located around the periphery of analog DUV 65A represent input nodes IN corresponding to locations where simulation signals are applied in response to corresponding random variables, and the four hollow squares located around the periphery of coverage variable CV represent output nodes O1 to O4 representing four coverage point solutions associated with coverage variable CV. For explanatory purposes, each straight line section represents a corresponding random variable pattern portion. In this diagram, dashed lines represent signal paths SP that do not reach coverage variable CV, and solid lines SP11 to SP14, SP2 and SP31 to SP34 are graphic representations of random variable pattern portions that form four signal path solutions that reach output nodes O1 to O4 of coverage variable CV. As mentioned above, the inventors observed that the random variables needed to cover all solutions of a multiple-solution coverage variable are functionally related. This observation is depicted by way of showing all four signal paths from input node N1 to coverage variable CV include a commonly utilized path portion SP1 (i.e., formed by signals paths sections SP11 to SP14), a shared path portion SP2, and four unique path portions SP31 to SP34 that respectively connect to output nodes O1 to O4. That is, to reach coverage variable CV, a given random variable is required to include first pattern portions that generate signal paths SP11 to SP14, a second pattern portions that generate signal path SP2, and third pattern portions that generate only one of signal path SP31 (i.e., to reach output node O1), signal path SP32 (i.e., to reach output node O2), signal path SP33 (i.e., to reach output node O3), or signal path SP34 (i.e., to reach output node O4). In other words, each of the four random variables needed to reach coverage variable CV include some pattern portions that are different from the other four random variables (i.e., each includes a different pattern portion generating an associated one of signal paths SP31 to SP34), and all four of these random variables include common (the same) pattern portions that generate signal paths SP11 to SP14 and SP2. In the example shown in FIG. 3, the pattern portions that generate signal paths SP11 to SP14 and SP2 represent one type of functionally relationship between the four corresponding random variables and coverage variable CV.

Figure 4A:
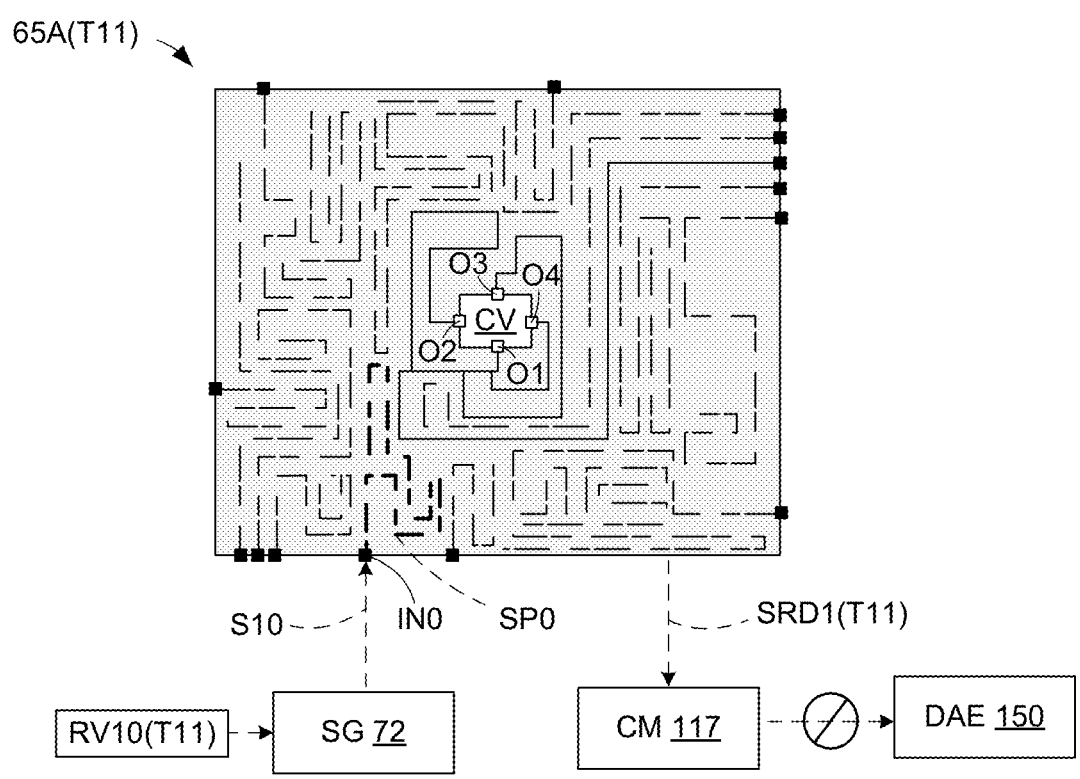
FIGS. 4A and 4B show the analogous DUV of FIG. 3 during two different time periods, respectively, during a first simulation process phase.
Figure 4B:
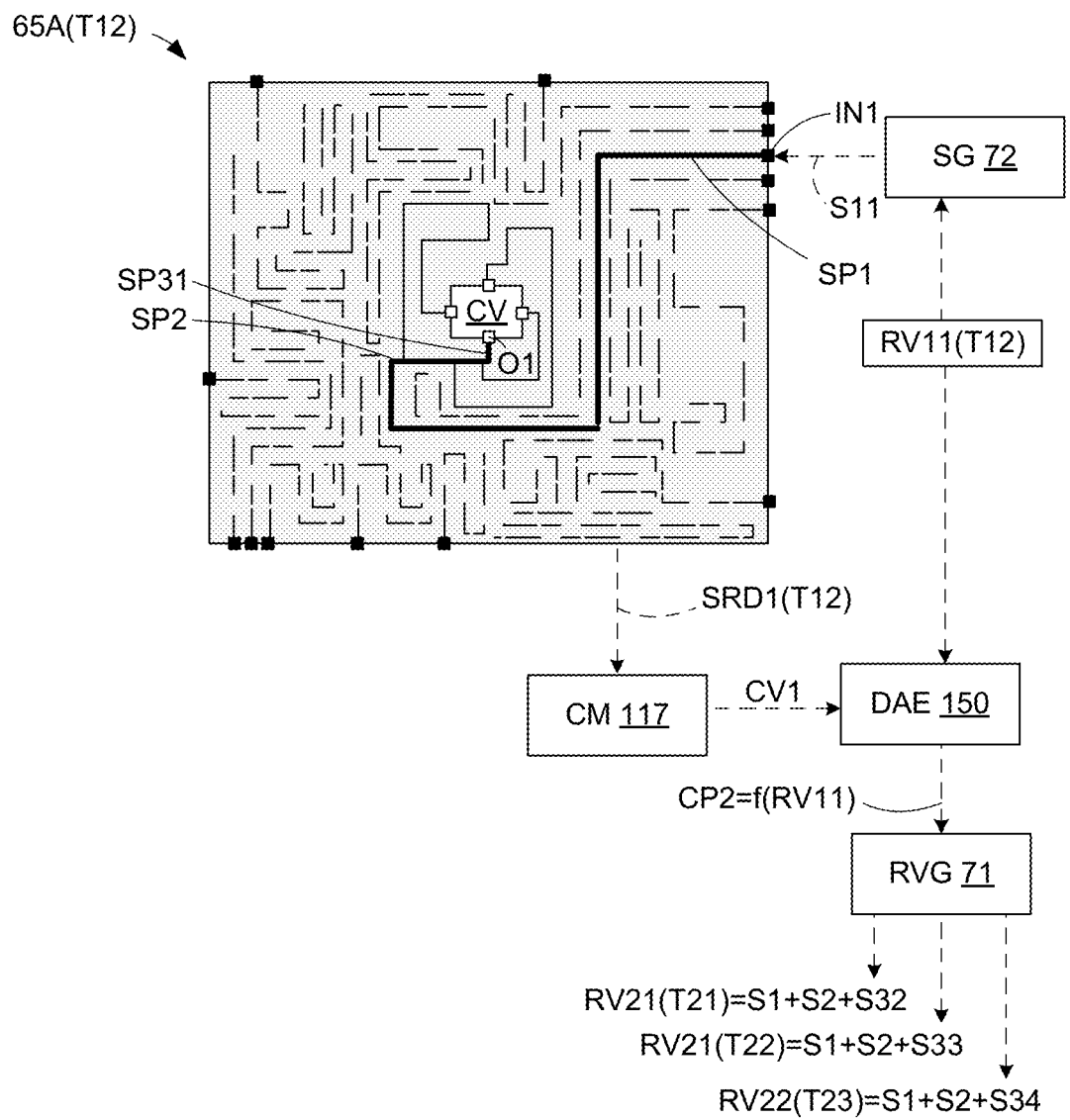

FIGS. 4A and 4B depict analog DUV 65A during a simplified first simulation process phase using initial random variables RV10 and RV11 generated in accordance with initial constraint parameters.

As indicated in FIG. 4A, initial random variable RV10 is utilized by stimulus generator 72 to generate stimulus data S10 during a first time period T11 of the first simulation phase, thereby a signal path SP0 is formed from an input node IN0 to an interior portion of analog DUV 65 (i.e., as indicated by heavy dashed lines). That is, the various data values associated with initial random variable RV10 specify actuation of analog DUV 65A in an analogous manner to that depicted by signal path SP0. Note that signal path SP0 does not reach any of output nodes O1 to O4, and therefore simulation result data SRD1(T11) does not include a sampled coverage variable, no sampled coverage variable is supplied to data analysis engine 150 during time period T11.

As indicated in FIG. 4B, initial random variable RV11 is utilized by stimulus generator 72 to generate stimulus data S11 during a second time period T12 of the first simulation phase, thereby forming a signal path from input node IN1 along commonly utilized path portion SP1, shared path portion SP2 and unique path portion SP31 to output node O1 of coverage variable CV. That is, the various pattern portions associated with initial random variable RV11 specify actuation of analog DUV 65A in an analogous manner depicted by the heavy solid lines in FIG. 4B, which represent one of the four possible coverage solutions associated with coverage point variable CV. In this case, because output node O1 is reached by signal path S1+S2+S31, the simulation result data generated during time period T12 includes corresponding coverage variable CV1 (i.e., the coverage solution associated with output node O1), and therefore sampled coverage variable CV1 is supplied to data analysis engine 150. As set forth above, data analysis engine 150 utilizes sampled coverage variable CV1 to identify corresponding initial random variable RV11, and generates revised constraint parameters CP2 as a function of corresponding initial random variable RV11. As indicated near the bottom of FIG. 4B, during the subsequent (second) simulation process phase random variable generator 71 generates focused random variables RV21, RV22 and RV23 in accordance with corresponding initial random variable RV11. In practice, focused random variables are generated during the second simulation process phase by way of combining selected functionally related pattern portions of random variable RV11 with randomly generated pattern portions, whereby (assuming a large enough number of different focused random variables RV2 are generated that comply with revised constraint parameter CP2) there is a high probability that three of the focused random variables include the remaining three coverage solutions for coverage variable CV. For brevity, each of focused random variables RV21, RV22 and RV23 is represented as including one of the three remaining coverage solutions, with focused random variable RV21 having pattern portions associated with signal path portions SP1+SP2+SP32, focused random variable RV22 having pattern portions associated with signal path portions SP1+SP2+SP33, and focused random variable RV23 having pattern portions associated with signal path portions SP1+

SP2+SP34. Note that in practice many additional focused random variables are typically generated that do not reach a coverage point solution.

Figure 5A:
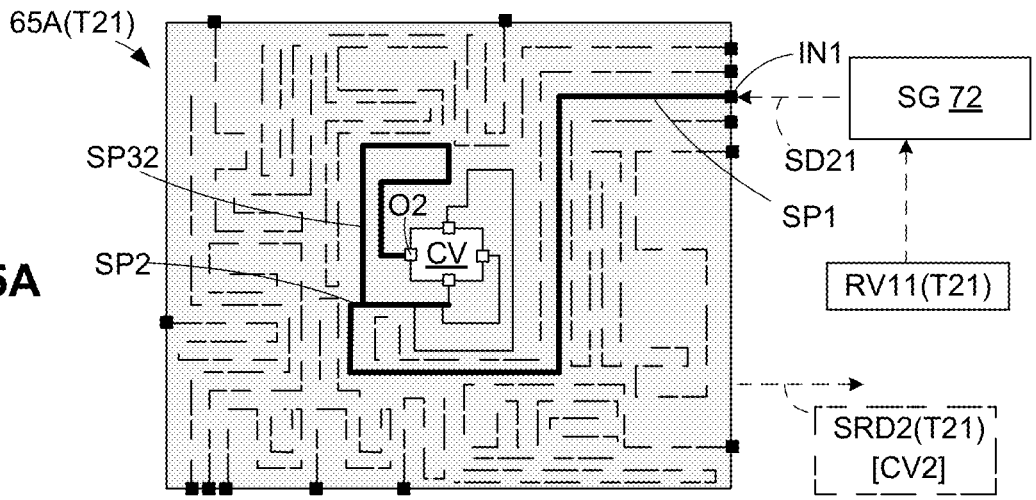
FIGS. 5A, 5B and 5C show the analogous DUV of FIG. 3 during three different time periods, respectively, during a second simulation process phase.
Figure 5B:
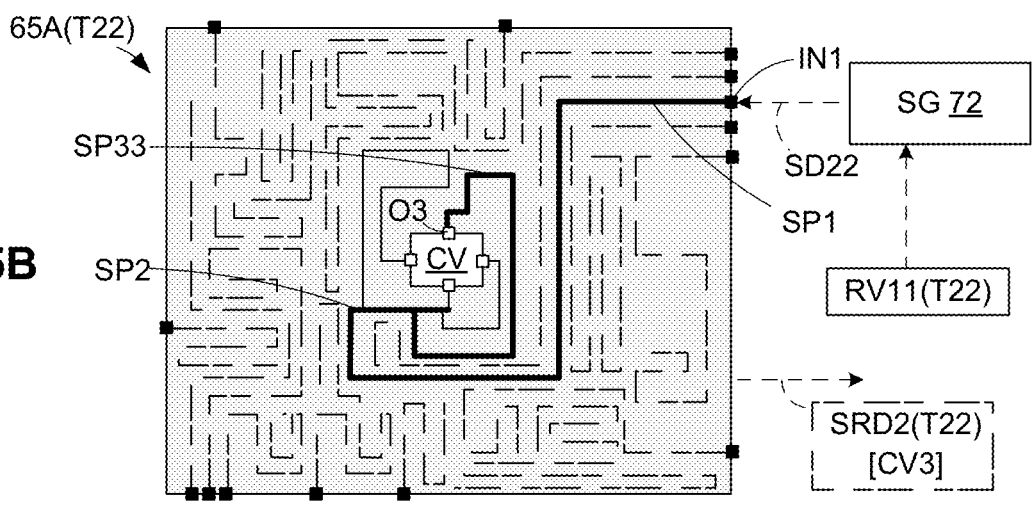
Figure 5C:
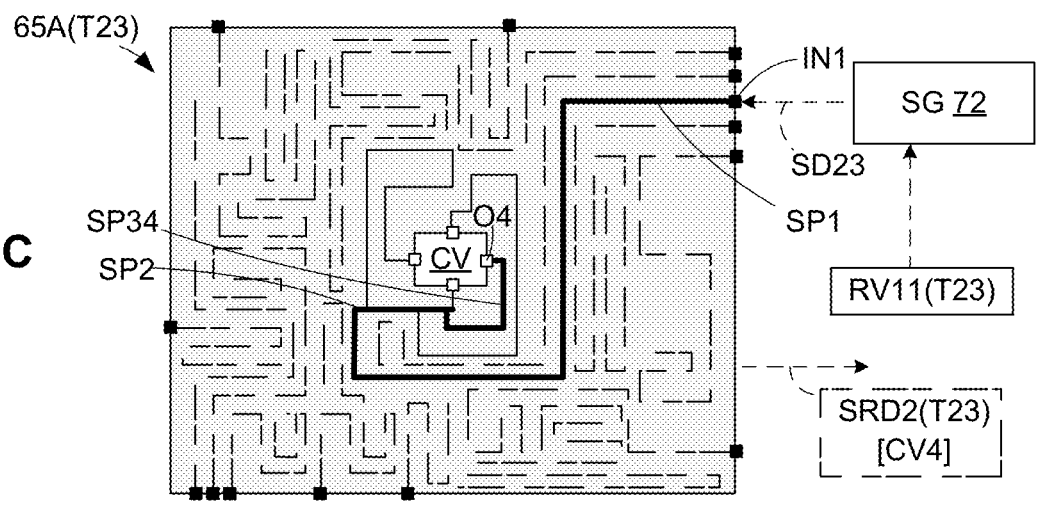

FIGS. 5A to 5C depict three time periods T21, T22 and T23 during the second simulation process phase when focused random variables RV21, RV22 and RV23 are utilized to stimulate analog DUV 65A. FIG. 5A shows analog DUV 65A at time T21 when focused random variable RV21 is submitted to stimulus generator 72, which in turn generates stimulus data SD21 that effectively forms signal path S1+S2+S32 between input node IN1 and output node O2 of coverage variable CV, whereby simulation result data SDR2 during time period T21 includes a second coverage solution/variable CV2. FIG. 5B shows analog DUV 65A at time T22 when focused random variable RV22 is submitted to stimulus generator 72, which in turn generates stimulus data SD22 that effectively forms signal path S1+S2+S33 between input node IN1 and output node O3 of coverage variable CV, whereby simulation result data SDR2 during time period T22 includes a third coverage solution/variable CV3. FIG. 5C shows analog DUV 65A at time T23 when focused random variable RV23 is submitted to stimulus generator 72, which in turn generates stimulus data SD23 that effectively forms signal path S1+S2+S34 between input node IN1 and output node O4 of coverage variable CV, whereby simulation result data SDR2 during time period T23 includes a fourth coverage solution/variable CV4. Accordingly, coverage solution variables CV2, CV3 and CV4 associated with output nodes O2 to O4 of coverage variable CV are reached by way of generating revised constraint parameters CP2 based on corresponding initial random variable RV11, then using revised constraint parameters CP2 to automatically generate focused random variables RV21 to RV23 during the second simulation, whereby the present invention provides 100% coverage of coverage variable CV.

Figure 6A:
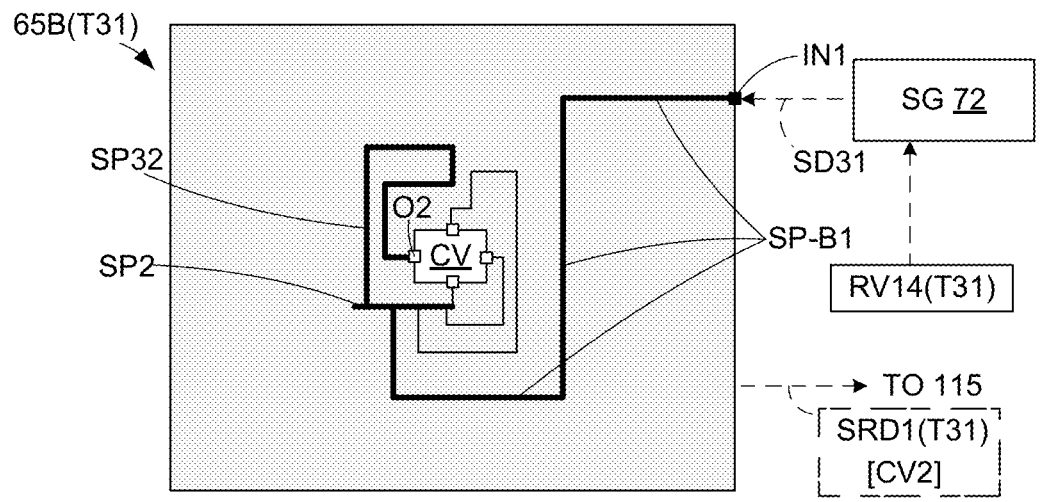
FIGS. 6A and 6B are diagrams depicting another simplified DUV using the analogous graphic format of FIG. 3 during a first simulation process phase.
Figure 6B:
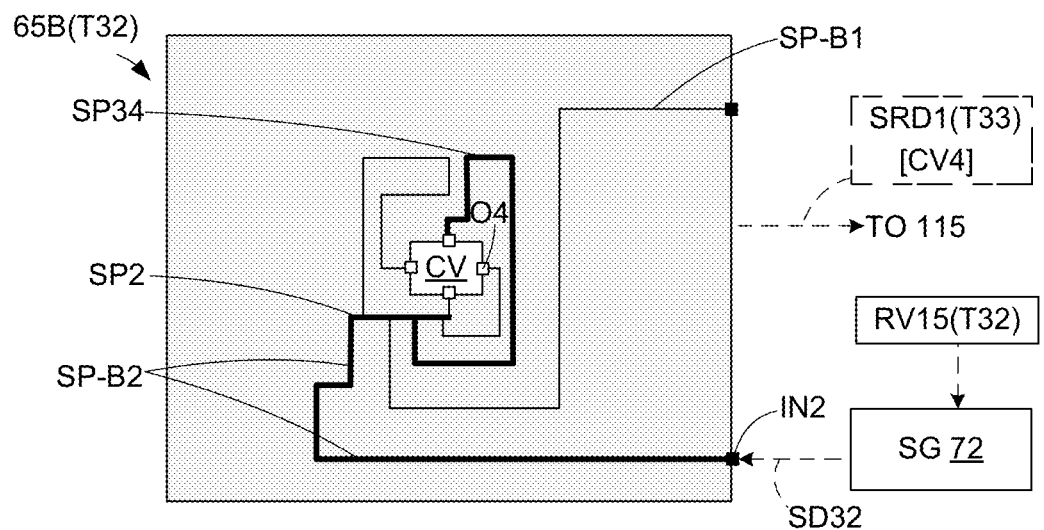
Figure 7:
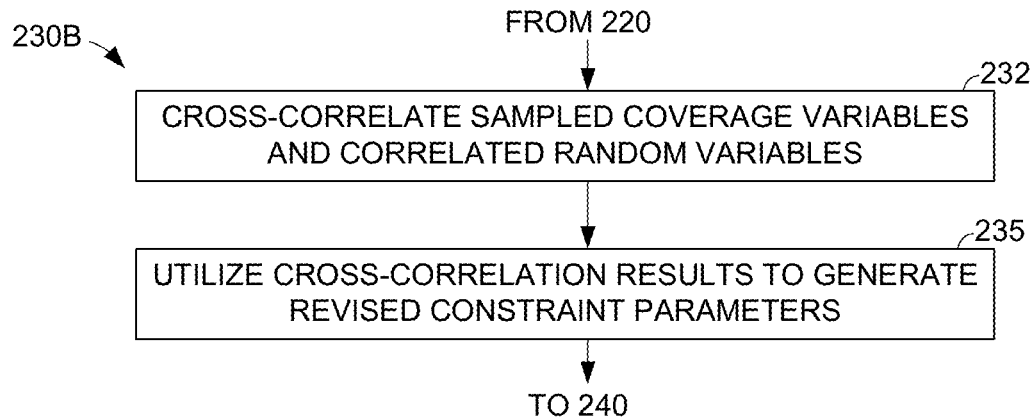
FIG. 7 is a flow diagram depicting a method for generating revised constraint parameters according to a specific embodiment of the present invention.

FIGS. 6A and 6B depict another analog DUV 65B during another simplified first simulation process phase using initial random variables RV14 and RV15 generated in accordance with corresponding initial constraint parameters. Note that analog DUV 65B includes coverage variable CV having four output nodes/solutions that are accessed by way of signal path portion SP2 in the manner described above with reference to analog DUV 65A (discussed above), but in this example signal path portion SP2 is accessible by way of multiple input nodes and associated signal path portions. For example, FIG. 6A depicts the generation of stimulus data SD31 in response to initial random variable RV14 at time T31, whereby a signal path SP–B1+SP2+SP32 is formed between input node IN1 and output node O2 of coverage variable CV, and simulation result data SRD1 includes coverage variable CV2. Similarly, FIG. 6B depicts the generation of stimulus data SD31 in response to initial random variable RV15 at time T32, whereby a signal path SP–B2+SP2+SP34 is formed between a second input node IN2 and output node O4 of coverage variable CV, and simulation result data SRD1 includes coverage variable CV4. In this embodiment, initial random variables RV14 and RV15 are cross-correlated with the associated sampled coverage variables CV2 and CV4 (see block 232 of flow diagram 230B, shown in FIG. 7), and then the results of the cross-correlation process are utilized to generate a corresponding revised constraint parameter (see block 235 of flow diagram 230B, shown in FIG. 7). For example, it is readily evident from the signal paths shown in FIGS. 6A and 6B that signal path portion SP2 is common to both initial random variables RV14 and RV15 and to both sampled coverage variables CV2 and CV4. Accordingly, a revised constraint parameter generated in accordance with a cross-correlation process involving the examples shown in FIGS. 6A and 6B might be "include signal path portion SP2 in any focused random variable". With this revised constraint parameter, it is readily apparent that coverage variables CV1 and CV3 would probably be reached during the subsequent (second) simulation process phase performed in the manner described above in which focused random variables are generated in accordance with the "use signal path portion SP2" revised constraint parameter.

As set forth above, the present invention provides a methodology that automates the procedure of identifying the effecting random variables responsible for hitting the coverage goals for a cover point. The proposed framework analyses the sampled coverage point solutions from the first phase simulation results and the corresponding initial random variables, and computes relationships between the coverage points and the corresponding random variables. With these relationships, an improved testbench/simulator configuration is able to automatically determine the set of random variables affecting the cover points, and hence it is possible to systematically tune related set of random variables to get higher coverage. The basic intent of the invention is to develop a model which helps in data analysis to improve coverage of a design, as illustrated in FIG. 8.

The novel technique reduces the need to manually analyze sampled values of the coverage points and manually create or tune constraint parameters in order to increase coverage. While investigating a lot of modern design/testbenches, the inventors observed that sampled values of many of the coverage point variables have some functional relation with the random variables. In other words, if the coverage variable (CV) is sampled for sample/cross, then that variable quite often will be either directly connected to or a function of some random variable (RV) of the same design/testbench. Since HDL simulation happens sequentially, different values of RV and CV are generated over various time stamps. The number of randomizations may also be quite different from the number of times the coverage variables are sampled. However, it is observed that there is higher likelihood that if some CV is sampled at time $c_x$, then the last RV that gets generated just before $c_x$ will most likely be related with the sampled CV. For example: If CV's are sampled at times 10, 20, 30, 40, and RV's are generated at times, 7, 9, 23, 32, then CV10 will be related to RV9, CV20, will be related to RV9, CV30 will be related to RV23. This observation led to data analytic approach of the present invention that correlates each sampled coverage variable with a corresponding initial random variable, which will eventually help in covering the samples/crosses dependent on that coverage variable.

Figure 8:
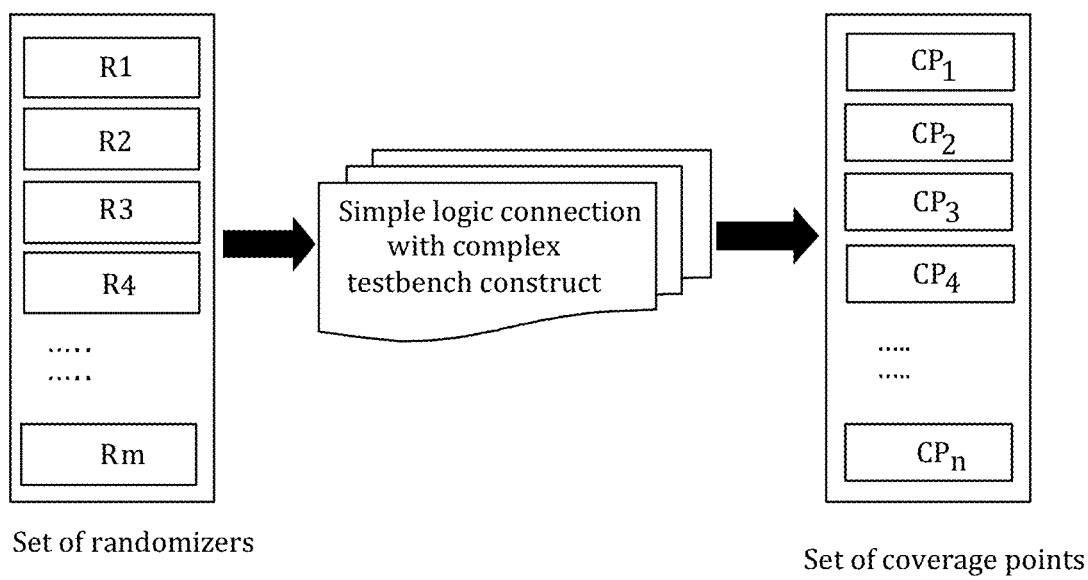
FIG. 8 is a block/flow diagram depicting a simplified process flow according to another embodiment of the present invention.
Figure 9:
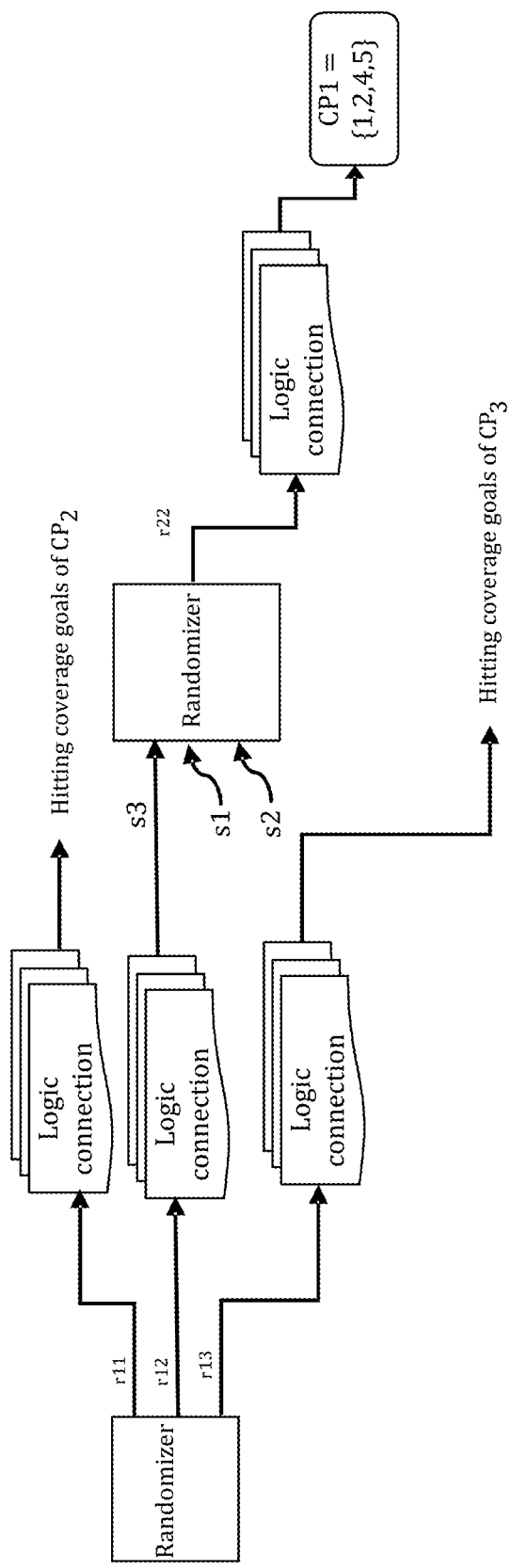
FIG. 9 is a block/flow diagram depicting a simplified process flow according to another embodiment of the present invention.
Figure 10:
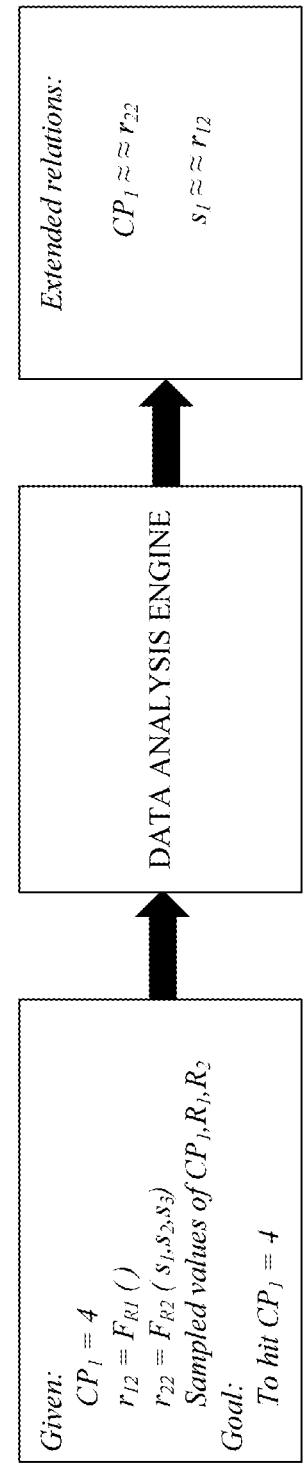
FIG. 10 is a block/flow diagram depicting a simplified process flow according to another embodiment of the present invention.

FIGS. 8 and 9 are flow diagrams that illustrates another example of a simple scenario in which the data analysis engine of the present invention analyzes the sampled cover point solution values and the correlated random variables and computes the relationship shown in the figures.

In a practical example, when extracting the sampled coverage variables and correlated random variables, the simulation result data is dumped for a randomized object (initial random variable) and a coverage group in the following format:

```
<cg> vtile_status_ivc_pkg::vtile_status_ivc_coverage:
:ptile_state_cov_item::cg__vtile_ptile_state @0 ps
  <cp> cp__ptile_allocs_U1T1 2 0
  <cp> cp__ptile_allocs U1T3 2 0
  <cp> cp__zs_alloc_count_U1T1 32 0
```

-continued

```
<cp> cp__color_alloc_count_U1T1 32 0
<ro> warp_manager_ivc_seq_item @1769335000 ps
@rawtokens.v:345296
  <sv> i 32 0
  <sv> local::m_delay_type 32 1
  <sv> i 32 0
  <rv> ee_wm_drv_delay 32 3
  <rv> m_delay_type 32 1
  <rv> wm_ee_drv_delay 32 2
```

In the above example, <cg> gives the relevant information of a cover group, like sampling time and name of the cover group. The next few lines indented with <cp> gives the information of each of the cover point present in the coverage group along with the width of the variable and its sampled value. A similar representation is done for the randomized object. The line indented by <ro> gives the name of the randomized group along with the sampling time. The following lines indented by <rv> and <sv> gives the information of the name, width and sampled values of the random variables and state variable respectively.

In one embodiment, the data analysis engine preprocesses the simulation data, which involves extrapolating the values of the random variables at the instance when a cover point is sampled. This extrapolation (time-based association) is utilized to identify the random variable responsible for reaching each sampled cover point using a one-to-one correspondence between sample time of each cover point and the time when the corresponding random variable is utilized to stimulate the target DUV. The extrapolation is done based on the value of the initial random variable at an instant just before the sampling instance of the cover point solution. An exemplary typical data dumped for a coverage and random variable is depicted in Table 1, below.

TABLE 1

| | Time | | | | |
|---|---|---|---|---|---|
| | $t_1$ | $t_2$ | $t_3$ | $t_4$ | $t_5$ |
| Random Sampling events | $R_1$ | $R_2$ | $R_3$ | | $R_4$ |
| Coverage point Sampling events | $CV_1$ | | $CV_2$ | $CV_3$ | |

In Table 1, CV is the cover point variable, and it is sampled at $t_1$, $t_3$, $t_4$ and R is the random variable which generated $R_1$, $R_2$, $R_3$, $R_4$ value. A relationship is found by analyzing the values of the random variable and coverage variables at variable sampling points. A typical relation established can include: 1) if both happens at the same time their values are same (e.g., $R_1/CV_1$, and $R_2/CV_2$) are always found to be same); 2) the value of the coverage variable sampled, matches the last randomized variable (e.g., $CV_1=>R_1$, $CV_2=>R_3$, $CV_3=>R_3$); and 3) the CV value may be related to R values with some amount of delay. By modifying a testbench/simulator to include the data analysis engine described above, an improved coverage-type simulation/verification process is provided by way of automatically generating revised constraint parameters that systematically tune the focused random variables in order to enhance coverage of a related cover point.

Technology Specific EDA System/Workflow Explanation

Figure 11:
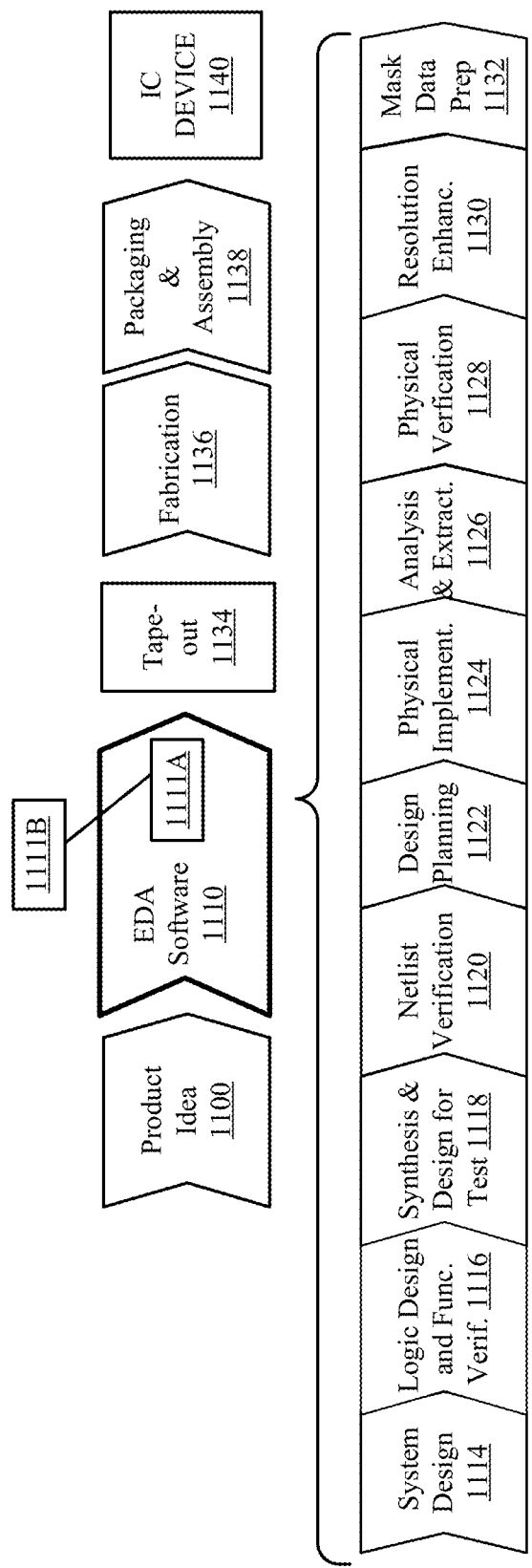
FIG. 11 is a flowchart illustrating various operations in the design and fabrication of an integrated circuit in accordance with an embodiment of the present disclosure.

FIG. 11 illustrates various processes performed in the design and fabrication of IC devices using software tools with a computer to transform data and instructions that represent the associated IC devices. These processes start with the generation of a product idea (1100) with information supplied by one or more circuit designers. The product idea is realized as the evolving circuit design during the circuit design process performed by the circuit designer(s) using EDA software tools (1110). One or more steps of the EDA software design process performed by EDA software tools (1110) is implemented using a computer-readable medium 1111A that is read by a computer 1111B. EDA software tools may also be signified herein using the singular "EDA software tool", as EDA software, or as a design tool. When a circuit design is finalized, it is typically taped-out (1134), and then multiple ICs, each being a physical implementation of the final circuit design, are fabricated on a semiconductor wafer (1136) using a selected technology node. The semiconductor wafer is then diced into individual chips, with each chip including one of the ICs, and then the chips are packaged and assembled using corresponding processes (1138), resulting in finished IC device 1140.

Note that the design process that uses EDA software tools (1110) includes operations 1114-1132, which are described below. This design flow description is for illustration purposes only and is not meant to limit the present disclosure. For example, an actual circuit design may require a circuit designer to perform the design operations in a different sequence than the sequence described herein.

During system design (1114), a circuit designer describes the functionality to be performed by the manufactured IC device. The designer can also perform what-if planning to refine the functionality and to check costs. Note that hardware-software architecture partitioning can occur at this stage. Exemplary EDA software products from Synopsys, Inc. of Mountain View, Calif. that can be used at this stage include: Model Architect, Saber, System Studio, and Designware products. Cells or other descriptions including all relevant information pertaining to specific circuit types are typically copied from a library accessible by way of the EDA software tool, and inserted into a circuit design during the system design process.

Then, during logic design and functional verification (1116), VHDL or Verilog code for modules in the circuit is written and the design is checked for functional accuracy. More specifically, the design is checked to ensure that it produces the correct outputs. The VHDL or Verilog code is software comprising optimized readable program instructions adapted for the efficient description of a logic design. Exemplary EDA software products from Synopsys, Inc. of Mountain View, Calif. that can be used at this stage include: VCS, Vera, Designware, Magellan, Formality, ESP and Leda products.

Next, during synthesis and design for test (1118), VHDL/Verilog code is translated to a netlist. This netlist can be optimized for the target technology. Additionally, tests can be designed and implemented to check the finished integrated circuit. Exemplary EDA software products from Synopsys, Inc. of Mountain View, Calif. that can be used at this stage include: Design Compiler, Physical Compiler, Test Compiler, Power Compiler, FPGA Compiler, Tetramax, and Designware products. In one embodiment, the improved test bench/method described herein may be utilized to verify netlists generated from early circuit design versions during synthesis and design.

Moreover, during netlist verification (1120), the netlist is checked for compliance with timing constraints and for correspondence with the VHDL/Verilog code. Exemplary EDA software products from Synopsys, Inc. of Mountain View, Calif. that can be used at this stage include: Formality, Primetime, and VCS products. In one embodiment, the improved test bench/method described herein may be utilized to verify netlists generated from associated circuit design versions during netlist verification.

Furthermore, during design planning (1122), an overall floor plan for the integrated circuit is constructed and analyzed for timing and top-level routing. Exemplary EDA software products from Synopsys, Inc. of Mountain View, Calif. that can be used at this stage include: Astro and IC Compiler products. In one embodiment, the improved test bench/method described herein may be utilized to verify circuit design versions generated during design planning.

Additionally, during physical implementation (1124), the placement (positioning of circuit elements such as transistors or capacitors) and routing (connection of the same by a plurality of conductors) occurs. Exemplary EDA software products from Synopsys, Inc. of Mountain View, Calif. that can be used at this stage include: In one embodiment, the improved test bench/method described herein may be utilized to verify the circuit design versions generated during design planning.

Then, during analysis and extraction (1126), the circuit function is verified at a transistor level, which permits refinement of the logic design. Exemplary EDA software products from Synopsys, Inc. of Mountain View, Calif. that can be used at this stage include: Astrorail, Primerail, Primetime, and Star RC/XT products. In one embodiment, the improved test bench/method described herein may be utilized to verify circuit design versions generated during analysis and extraction.

Next, during physical verification (1128), the design is checked to ensure correctness for manufacturing issues, electrical issues, lithographic issues, and circuitry. Exemplary EDA software products from Synopsys, Inc. of Mountain View, Calif. that can be used at this stage include the Hercules product.

Moreover, during resolution enhancement (1130), geometric manipulations of the layout are performed to improve manufacturability of the design. Exemplary EDA software products from Synopsys, Inc. of Mountain View, Calif. that can be used at this stage include: Proteus, Proteus, and PSMGED products.

Additionally, during mask-data preparation (1132), the 'tape-out' data for production of masks to produce finished integrated circuits is provided. Exemplary EDA software products from Synopsys, Inc. of Mountain View, Calif. that can be used at this stage include the Cats. family of products.

For all of the above mentioned integrated circuit design tools, similar tools from other EDA vendors, such as Cadence and Mentor Graphics can be used as an alternative. Additionally, similarly non-commercial tools available from universities can be used.

Embodiments of the present disclosure can be used during one or more of the above-described stages. Specifically, some embodiments of the present disclosure can be used in EDA software 1110.

A storage subsystem is preferably used to store the basic programming and data constructs that provide the functionality of some or all of the EDA tools described herein, and tools applied for development of cells for the library and for physical and logical design using the library. These software modules are generally executed by one or more processors in a manner known to those of ordinary skill in the art.

Hardware/Software Equivalence

Certain innovations, embodiments and/or examples described herein comprise and/or use a processor. As used herein, the term "processor" signifies a tangible information processing device that physically transforms information, for example, data. As defined herein, "data" signifies information that can be in the form of an electrical, magnetic, or optical signal that is capable of being stored, accessed, transferred, combined, compared, or otherwise manipulated by an information processing device.

The processor can be electronic, for example, comprising digital logic circuitry (for example, binary logic), or analog (for example, an operational amplifier). The processor can also be non-electronic, for example, as seen in processors based on optical signal processing, DNA transformations or quantum mechanics, or a combination of technologies, such as an optoelectronic processor. For information structured in binary form, any processor that can transform the information using the AND, OR and NOT logical operations (and their derivatives, such as the NAND, NOR, and XOR operations) can transform the information using any function of Boolean logic. A processor such as a neural network processor can also transform information non-digitally. There is no scientific evidence that any of these processors are processing, storing and retrieving information, in any manner or form equivalent to the bioelectric circuitry of the human brain.

As used herein, the term "module" signifies a tangible information processing device that typically is limited in size and/or complexity. For example, one or more methods or procedures in a computer program can be referred to as a module. A module can also refer to a small network of digital logic devices, in which the logic devices often may be interconnected to form a network. In many cases, methods and procedures in a computer program written in a specialized language, such as System C, can be used to generate a network of digital logic devices that process information with exactly the same results as are obtained from the methods and procedures.

A module can be permanently configured (e.g., hardwired to form hardware), temporarily configured (e.g., programmed with software), or a combination of the two configurations (for example, a structured ASIC). Permanently configured modules can be manufactured, for example, using Application Specific Integrated Circuits (ASICs) such as Arithmetic Logic Units (ALUs), Programmable Logic Arrays (PLAs), or Read Only Memories (ROMs), all of which are typically configured during manufacturing. Temporarily configured modules can be manufactured, for example, using Field Programmable Gate Arrays (FPGAs—for example, sold by Xilink or Altera), Random Access Memories (RAMs) or microprocessors. A module is configured to process information, typically using a sequence of operations to transform the information (or in the case of ROMs and RAMS, transforming information by using the input information as an address for memory that stores output information), to perform aspects of the present innovations, embodiments and/or examples of the invention.

Modules that are temporarily configured need not be configured at any one instance in time. For example, an information processor comprising one or more modules can have the modules configured at different times. The processor can comprise a set of one or more modules at one instance of time, and to comprise a different set of one or modules at a different instance of time. The decision to manufacture or implement a module in a permanently configured form, a temporarily configured form, or a combination of the two forms, may be driven by cost, time considerations, engineering constraints and/or specific design goals. The "substance" of a module's processing is independent of the form in which it is manufactured or implemented.

As used herein, the term "algorithm" signifies a sequence or set of operations or instructions that a module can use to transform information to achieve a result. A module can comprise one or more algorithms. As used herein, the term "computer" includes an information processor that can perform certain operations such as (but not limited to) the AND, OR and NOT logical operations, with the addition of memory (for example, memory based on flip-flops using the NOT-AND or NOT-OR operation). Such a digital computer is said to be Turing-complete or computationally universal. A computer, whether or not it is a digital computer, typically comprises many modules.

As used herein, the term "software" or "program" signifies one or more algorithms and data structures that configure an information processing device for use in the innovations, embodiments and examples described in this specification. Such devices configurable by software include one or more computers, for example, standalone, client or server computers, or one or more hardware modules, or systems of one or more such computers or modules. As used herein, the term "software application" signifies a set of instruction and data that configure the information processing device to achieve a specific result, for example, to perform word processing operations, or to encrypt a set of data.

As used herein, the term "programming language" signifies a grammar and syntax for specifying sets of instruction and data that comprise software. Programming languages include assembler instructions, instruction-set-architecture (ISA) instructions, machine instructions, machine dependent instructions, microcode, firmware instructions, state-setting data, or either source code or object code written in any combination of one or more higher level languages, such as conventional procedural programming languages, for example, the "C" programming language or similar programming languages (such as SystemC), or object oriented programming language such as Smalltalk, C++ or the like, and any future equivalent programming languages.

Software is entered into, equivalently, read into, one or memories of the computer or computer system from an information storage device. The computer typically has a device for reading storage media that is used to transport the software, or has an interface device that receives the software over a network.

Technology Specific General Computer Explanation

Figure 12A:
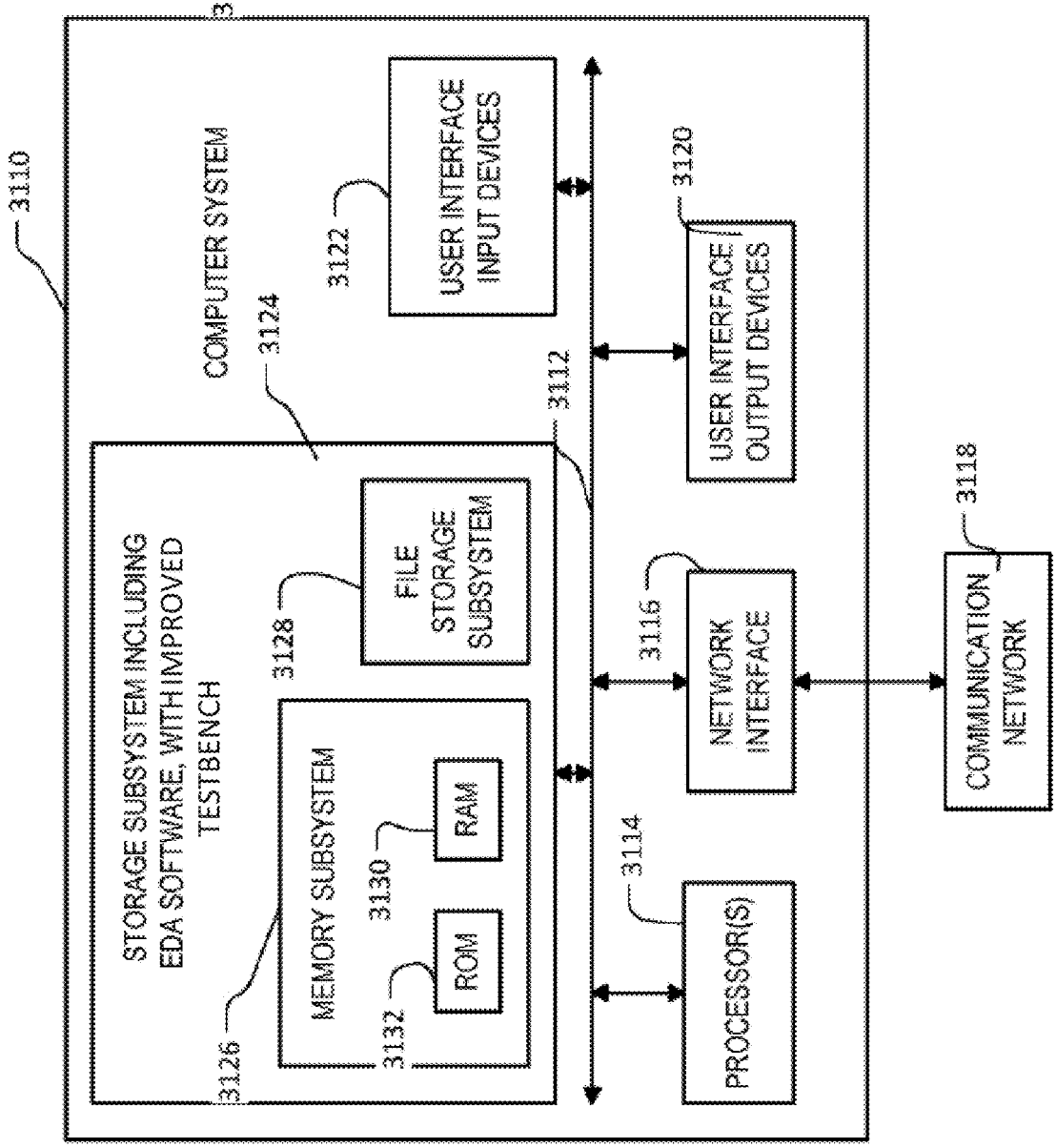
FIGS. 12A, 12B and 12C are simplified block diagrams of a computer system suitable for use with embodiments of the technology, as well as circuit design and circuit embodiments of the technology.
Figure 12B:
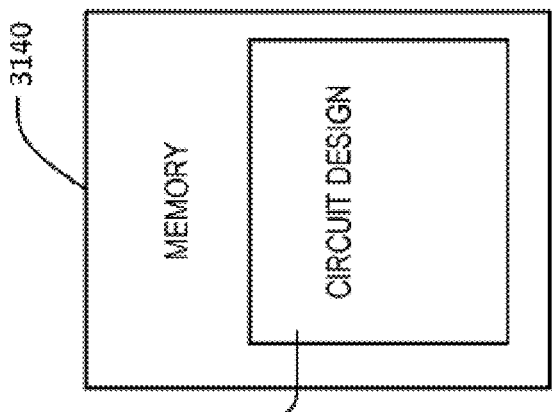
Figure 12C:
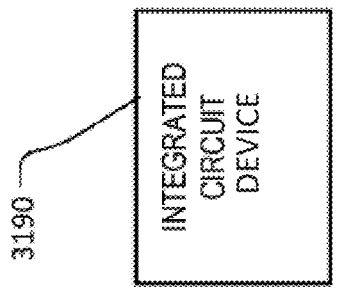

FIGS. 12A, 12B and 12C are simplified block diagrams of a computer system suitable for generating and verifying circuit designs using an EDA tool including the improved test bench of the present invention. Computer system 3110 typically includes at least one computer or processor 3114 which communicates with a number of peripheral devices via bus subsystem 3112. These peripheral devices may include a storage subsystem 3124, comprising a memory subsystem 3126 and a file storage subsystem 3128, user interface input devices 3122, user interface output devices 3120, and a network interface subsystem 3116. The input and output devices allow user interaction with computer system 3110.

The computer system may be a server computer, a client computer, a workstation, a mainframe, a personal computer (PC), a tablet PC, a set-top box (STB), a personal digital assistant (PDA), a cellular telephone, a smartphone, a web appliance, a television, a network router, switch or bridge, or any data processing machine capable of executing instructions (sequential or otherwise) that specify actions to be taken by that machine. Innovations, embodiments and/or examples of the claimed inventions are neither limited to conventional computer applications nor the programmable apparatus that run them. To illustrate, the innovations, embodiments and/or examples of the claimed inventions can include an optical computer, quantum computer, analog computer, or the like. Aspects of the present invention are well suited to multi-processor or multi-core systems and may use or be implemented in distributed or remote systems. Processor here is used in the broadest sense to include singular processors and multi-core or multi-processor arrays, including graphic processing units, digital signal processors, digital processors and combinations of these elements. Further, while only a single computer system or a single machine may be illustrated, the use of a singular form of such terms shall also signify any collection of computer systems or machines that individually or jointly execute instructions to perform any one or more of the sets of instructions discussed herein. Due to the ever-changing nature of computers and networks, the description of computer system 3110 depicted in FIG. 12A is intended only as a specific example for purposes of illustrating the preferred embodiments. Many other configurations of computer system 3110 are possible having more or less components than the computer system depicted in FIG. 12A.

Network interface subsystem 3116 provides an interface to outside networks, including an interface to communication network 3118, and is coupled via communication network 3118 to corresponding interface devices in other computer systems or machines. Communication network 3118 may comprise many interconnected computer systems, machines and communication links. These communication links may be wireline links, optical links, wireless links, or any other devices for communication of information. Communication network 3118 can be any suitable computer network, for example the Internet.

User interface input devices 3122 may include a keyboard, pointing devices such as a mouse, trackball, touchpad, or graphics tablet, a scanner, a touchscreen incorporated into the display, audio input devices such as voice recognition systems, microphones, and other types of input devices. In general, use of the term "input device" is intended to include all possible types of devices and ways to input information into computer system 3110 or onto communication network 3118. User interface output devices 3120 may include a display subsystem, a printer, a fax machine, or non-visual displays such as audio output devices. The display subsystem may include a cathode ray tube (CRT), a flat-panel device such as a liquid crystal display (LCD), a projection device, or some other device for creating a visible image such as a virtual reality system. The display subsystem may also provide nonvisual display such as via audio output devices. In general, use of the term "output device" is intended to include all possible types of devices and ways to output information from computer system 3110 to the user or to another machine or computer system.

Memory subsystem 3126 typically includes a number of memories including a main random access memory (RAM) 3130 for storage of instructions and data during program execution and a read only memory (ROM) 3132 in which fixed instructions are stored. In one embodiment, RAM 3130 also serves to store test vector value and other data utilized during execution of the multi-dimensional constraint solver described herein. File storage subsystem 3128 provides persistent storage for program and data files, and may include a hard disk drive, a floppy disk drive along with associated removable media, a CD-ROM drive, an optical drive, or removable media cartridges. The databases and modules implementing the functionality of certain embodiments may be stored by file storage subsystem 3128. Bus subsystem 3112 provides a device for letting the various components and subsystems of computer system 3110 communicate with each other as intended. Although bus subsystem 3112 is shown schematically as a single bus, alternative embodiments of the bus subsystem may use multiple busses.

When configured to execute an EDA software tool including the improved test bench described herein, computer system 3110 depicted in FIG. 12A represents an electronic structure suitable for creating and/or testing (verifying) a circuit design. FIG. 12B shows a memory 3140 such as a non-transitory, computer readable data storage medium associated with file storage subsystem 3128, and/or with network interface subsystem 3116, and includes a data structure 3180 specifying a circuit design describing an integrated circuit. The memory 3140 can be a hard disk, a floppy disk, a CD-ROM, an optical medium, removable media cartridge, or other medium that stores computer readable data in a volatile or non-volatile form. Software read into a computer from such a memory can be converted at a selected instance in time from a tangible form to a transmission signal that is propagated through a medium (such as a network, connector, wire, or trace as an electrical pulse or a medium such as space or an atmosphere as electromagnetic radiation with wavelengths in the electromagnetic spectrum longer than infrared light). FIG. 12C is a block representing an IC 3190 designed and fabricated in accordance with the processes described above, where circuit 3190 is fabricated in accordance with the circuit design of data structure 3180 (see FIG. 12B).

The foregoing Detailed Description signifies in isolation individual features, structures or characteristics described herein and any combination of two or more such features, structures or characteristics, to the extent that such features, structures or characteristics or combinations thereof are based on the present specification as a whole in light of the knowledge of a person skilled in the art, irrespective of whether such features, structures or characteristics, or combinations thereof, solve any problems disclosed herein, and without limitation to the scope of the claims. When an embodiment of a claimed invention comprises a particular feature, structure, or characteristic, it is within the knowledge of a person skilled in the art to use such feature, structure, or characteristic in connection with other embodiments whether or not explicitly described.

In view of the foregoing Detailed Description it will be evident to a person skilled in the art that many variations may be made within the scope of innovations, embodiments and/or examples, such as function and arrangement of elements, described herein without departing from the principles described herein. One or more elements of an embodiment may be substituted for one or more elements in another embodiment, as will be apparent to those skilled in the art. The embodiments described herein were chosen and described to signify the principles of the invention and its useful application, thereby enabling others skilled in the art to understand how various embodiments and variations are suited to the particular uses signified.

The foregoing Detailed Description of innovations, embodiments, and/or examples of the claimed inventions has been provided for the purposes of illustration and description. It is not intended to be exhaustive nor to limit the claimed inventions to the precise forms described, but is to be accorded the widest scope consistent with the principles and features disclosed herein. Obviously, many variations will be recognized by a person skilled in this art. Without limitation, any and all equivalents described, signified or incorporated by reference in this patent application are specifically incorporated by reference into the description herein of the innovations, embodiments and/or examples. In addition, any and all variations described, signified or incorporated by reference herein with respect to any one embodiment are also to be considered taught with respect to all other embodiments. Any such variations include both currently known variations as well as future variations, for example any element used herein includes a future equivalent element that provides the same function, regardless of the structure of the future equivalent.

It is intended that the scope of the claimed inventions be defined and judged by the following claims and equivalents. The following claims are hereby incorporated into the Detailed Description, with each claim standing on its own as a separate embodiment. Disclosed embodiments can be described with more features than are expressly recited in the claims.

The invention claimed is:

1. In an electronic design automation (EDA) tool in a computer, a testbench configured to generate simulation data applied to a device-under-verification (DUV) during a simulation process and to receive simulation result data generated by said DUV in response to said applied simulation data, wherein said simulation result data includes a coverage point solution variable each time said simulation data causes the DUV to reach a corresponding coverage point operating state, said testbench including instructions stored on a computer-readable medium such that, when executed by a processor of said computer, cause the processor to perform operations comprising:
    performing a first simulation process phase using a plurality of initial random variables generated in accordance with initial constraint parameters such that the DUV generates first simulation result data corresponding to the plurality of initial random variables;
    identifying a corresponding first initial random variable using a time-based association process that correlates a time when the corresponding first initial random variable is used to perform the first simulation process phase with a sample time when a first coverage point solution variable is sampled from said first simulation result data;
    generating one or more revised constraint parameters based on the identified first initial random variable; and
    performing a second simulation process phase using a plurality of focused random variables generated in accordance with said one or more revised constraint parameters.

2. The testbench of claim 1, wherein performing the first simulation process phase comprises utilizing a random variable generator to sequentially generate said plurality of initial random variables in accordance with said initial constraint parameters, utilizing a stimulus generator to generate first-phase stimulus data in accordance with said initial random variables, utilizing a simulator to apply said first-phase stimulus data to said DUV, and utilizing a data analyzer to monitor said first-phase simulation result data generated by said DUV in response to said applied first-phase simulation data.

3. The testbench of claim 2, wherein identifying said corresponding first initial random variable comprises correlating a first time-stamp value corresponding to a time period in which said first coverage point solution variable was sampled with a second time-stamp value corresponding to a time period in which said corresponding first initial random variable was generated by said random variable generator.

4. The testbench of claim 3,
wherein the data analyzer includes a coverage monitor configured to sample said first coverage point solution variable from said first-phase simulation result data, and
wherein the testbench further comprises a data analysis engine configured to receive said sequentially generated plurality of initial random variables and a plurality of second time-stamp values from said random variable generator, configured to receive said sampled first coverage point solution variable and said first time-stamp value from said coverage monitor, and configured to identify said corresponding first initial random variable by matching said first time-stamp value with a corresponding second time-stamp value of said plurality of second time-stamp values that is associated with said first initial random variable.

5. The testbench of claim 4, wherein said data analysis engine is further configured to cross-correlate said first coverage point solution variable and said corresponding initial random variable to identify functionally related pattern portions in said corresponding initial random variable, configured to utilize said functionally related pattern portions to generate said revised constraint parameters, and configured to transmit said revised constraint parameters to said random variable generator when said testbench performssaid second simulation process phase.

6. The testbench of claim 2, wherein performing the second simulation phase comprises utilizing said random variable generator to generate said focused random variables in accordance with said revised constraint parameters, utilizing said stimulus generator to generate second-phase stimulus data in accordance with said focused random variables, and utilizing said simulator to apply said second-phase stimulus data to said DUV.

7. The testbench of claim 1, wherein generating said one or more revised constraint parameters comprises:
cross-correlating said first coverage point solution variable and said corresponding initial random variable; and
utilizing results from said cross-correlating to generate said revised constraint parameters.

8. A computer implemented method for performing coverage verification of a device-under-verification (DUV) using a simulation process including applying simulation data to the DUV and receiving simulation result data generated by said DUV in response to said applied simulation data, wherein said simulation result data includes a coverage point solution variable each time said simulation data causes the DUV to reach a corresponding coverage point operating state, said method comprising:
performing a first simulation process phase using a plurality of initial random variables generated in accordance with initial constraint parameters such that the DUV generates first simulation result data corresponding to the plurality of initial random variables;
identifying a corresponding first initial random variable using a time-based association process that correlates a time when the corresponding first initial random variable is used to perform the first simulation process phase with a sample time when a first coverage point solution variable is sampled from said first simulation result data;
generating one or more revised constraint parameters using one or more functionally related pattern portions of the identified first initial random variable; and
performing a second simulation process phase using a plurality of focused random variables generated in accordance with said one or more revised constraint parameters.

9. The method of claim 8, wherein performing the first simulation process phase comprises utilizing a random variable generator to sequentially generate said plurality of initial random variables in accordance with said initial constraint parameters, utilizing a stimulus generator to generate first-phase stimulus data in accordance with said initial random variables, utilizing a simulator to apply said first-phase stimulus data to said DUV, and utilizing a data analyzer to monitor said first-phase simulation result data generated by said DUV in response to said applied first-phase simulation data.

10. The method of claim 9, wherein identifying said corresponding first initial random variable comprises correlating a first time-stamp value corresponding to a time period in which said first coverage point solution variable was sampled with a second time-stamp value corresponding to a time period in which said corresponding first initial random variable was generated by said random variable generator.

11. The method of claim 10,
wherein the data analyzer includes a coverage monitor configured to sample said first coverage point solution variable from said first-phase simulation result data, and
wherein the method further comprises matching said first time-stamp value with a second time-stamp value assigned to said first initial random variable.

12. The method of claim 11, wherein the method further comprises:
cross-correlating said first coverage point solution variable and said corresponding initial random variable to identify said functionally related pattern portions in said corresponding initial random variable;
utilizing said functionally related pattern portions to generate said revised constraint parameters; and
transmitting said revised constraint parameters to said random variable generator during said second simulation process phase.

13. The method of claim 9, wherein performing the second simulation phase comprises utilizing said random variable generator to generate said focused random variables in accordance with said revised constraint parameters, utilizing said stimulus generator to generate second-phase stimulus data in accordance with said focused random variables, and utilizing said simulator to apply said second-phase stimulus data to said DUV.

14. The method of claim 8, wherein generating said one or more revised constraint parameters comprises:
cross-correlating said first coverage point solution variable and said corresponding initial random variable; and
utilizing results from said cross-correlating to generate said revised constraint parameters.

15. An apparatus, comprising: a processor; and a non-transitory computer-readable storage medium storing instructions that, when executed by the processor, cause the processor to perform coverage verification operations of a device-under-verification (DUV) using a simulation process including applying simulation data to the DUV and receiving simulation result data generated by said DUV in response to said applied simulation data, wherein said simulation result data includes a coverage point solution variable each time said simulation data causes the DUV to reach a corresponding coverage point operating state, and wherein said operations include:

performing a first simulation process phase using a plurality of initial random variables generated in accordance with initial constraint parameters such that the DUV generates first simulation result data corresponding to the plurality of initial random variables;

identifying a corresponding first initial random variable using a time-based association process that correlates a time when the corresponding first initial random variable is used to perform the first simulation process phase with a sample time when a first coverage point solution variable is sampled from said first simulation result data;

generating one or more revised constraint parameters using one or more functionally related pattern portions of the identified first initial random variable; and performing a second simulation process phase using a plurality of focused random variables generated in accordance with said one or more revised constraint parameters.

16. The apparatus of claim 15, wherein performing the first simulation process phase comprises utilizing a random variable generator to sequentially generate said plurality of initial random variables in accordance with said initial constraint parameters, utilizing a stimulus generator to generate first-phase stimulus data in accordance with said initial random variables, utilizing a simulator to apply said first-phase stimulus data to said DUV, and utilizing a data analyzer to monitor said first-phase simulation result data generated by said DUV in response to said applied first-phase simulation data.

17. The apparatus of claim 16, wherein identifying said corresponding first initial random variable comprises correlating a first time-stamp value corresponding to a time period in which said first coverage point solution variable was sampled with a second time-stamp value corresponding to a time period in which said corresponding first initial random variable was generated by said random variable generator.

18. The apparatus of claim 17,
wherein the data analyzer includes a coverage monitor configured to sample said first coverage point solution variable from said first-phase simulation result data, and
wherein the method further comprises matching said first time-stamp value with a second time-stamp value assigned to said first initial random variable.

19. The apparatus of claim 18, wherein the method further comprises:
cross-correlating said first coverage point solution variable and said corresponding initial random variable to identify said functionally related pattern portions in said corresponding initial random variable;
utilizing said functionally related pattern portions to generate said revised constraint parameters; and
transmitting said revised constraint parameters to said random variable generator during said second simulation process phase.

20. The apparatus of claim 16, wherein performing the second simulation phase comprises utilizing said random variable generator to generate said focused random variables in accordance with said revised constraint parameters, utilizing said stimulus generator to generate second-phase stimulus data in accordance with said focused random variables, and utilizing said simulator to apply said second-phase stimulus data to said DUV.

* * * * *